United States Patent
Chiu et al.

(10) Patent No.: US 7,884,690 B2
(45) Date of Patent: Feb. 8, 2011

(54) PRECISE MULTI-POLE MAGNETIC COMPONENT

(75) Inventors: Kuo-Chi Chiu, Taoyuan County (TW); Der-Ray Huang, Hsinchu (TW); Han-Ping Shieh, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/580,073

(22) Filed: Oct. 15, 2009

(65) Prior Publication Data

US 2010/0033281 A1    Feb. 11, 2010

Related U.S. Application Data

(60) Continuation of application No. 11/197,428, filed on Aug. 5, 2005, now Pat. No. 7,656,259, which is a division of application No. 10/718,626, filed on Nov. 24, 2003, now Pat. No. 7,114,237.

(30) Foreign Application Priority Data

Sep. 2, 2003    (TW) .............................. 92124245 A

(51) Int. Cl.
*H01F 5/00* (2006.01)
*H01F 7/20* (2006.01)
*H01F 13/00* (2006.01)
*H01F 7/06* (2006.01)

(52) U.S. Cl. .................. 335/299; 335/284; 336/200; 336/232; 29/602.1; 29/830; 29/831; 29/832; 29/833; 29/834; 29/835

(58) Field of Classification Search ............... 335/284, 335/299; 336/200, 232; 29/602.1, 830–835
See application file for complete search history.

(56) References Cited

U.S. PATENT DOCUMENTS

| | | |
|---|---|---|
| 2,722,617 A | 11/1955 | Cluwen et al. |
| 3,893,059 A | 7/1975 | Nowak |
| 4,260,920 A | 4/1981 | Nakamura et al. |
| 4,271,370 A | 6/1981 | DiMeo |

(Continued)

OTHER PUBLICATIONS

Luo et al., "Multi-pole Magnetization of High Resolution Magnetic Encoder," Chicago '93 EEIC/ICWA Exposition, 1993, pp. 237-242.

*Primary Examiner*—Anh T Mai
*Assistant Examiner*—Mohamad A Musleh
(74) *Attorney, Agent, or Firm*—Birch, Stewart, Kolasch & Birch, LLP

(57) ABSTRACT

A method is provided to manufacture a precise multi-pole magnetic component for using in magnetic encoders. A special layout of the circuit pattern is designed and formed on a printed circuit board (PCB). Alternate and regular magnetic field is induced according to Ampere's law after a current flowing through the circuit on the PCB. The multi-pole magnetic component with fine magnetic pole pitch is achieved by forming the high-density circuit patterns on a substrate using the PCB technology.

12 Claims, 9 Drawing Sheets

U.S. PATENT DOCUMENTS

| | | | |
|---|---|---|---|
| 4,613,843 A | 9/1986 | Esper et al. | |
| 4,621,231 A | 11/1986 | Heinrich et al. | |
| 4,644,643 A | 2/1987 | Sudo | |
| 4,920,326 A | 4/1990 | Agarwala | |
| 4,922,606 A | 5/1990 | Alexander et al. | |
| 5,021,736 A | 6/1991 | Gonsalves et al. | |
| 5,070,317 A | 12/1991 | Bhagat | |
| 5,575,057 A | 11/1996 | Seitz | |
| 5,648,693 A | 7/1997 | Katoh et al. | |
| 5,745,981 A | 5/1998 | Roshen et al. | |
| 5,801,521 A | 9/1998 | Mizoguchie et al. | |
| 5,849,355 A | 12/1998 | McHenry | |
| 5,889,403 A | 3/1999 | Kawase et al. | |
| 5,949,321 A | 9/1999 | Grandmont et al. | |
| 6,023,214 A | 2/2000 | Ohta et al. | |
| 6,150,915 A | 11/2000 | O'Reilly et al. | |
| 6,373,404 B1 | 4/2002 | Chou et al. | |
| 6,414,564 B1 | 7/2002 | Mizoguchi et al. | |
| 6,420,953 B1 | 7/2002 | Dadafshar | |
| 6,456,068 B1 | 9/2002 | Kawase et al. | |
| 6,713,162 B2 | 3/2004 | Takaya et al. | |
| 6,831,544 B2 | 12/2004 | Patel et al. | |
| 6,834,426 B1 | 12/2004 | Japp et al. | |
| 6,884,945 B2 | 4/2005 | Kim et al. | |
| 6,902,660 B2 | 6/2005 | Lee et al. | |
| 6,970,064 B2 | 11/2005 | Zhang et al. | |
| 7,078,895 B1 | 7/2006 | Shoji et al. | |
| 7,114,237 B2 | 10/2006 | Chiu et al. | |
| 2004/0074086 A1 | 4/2004 | Yamaguchi et al. | |
| 2004/0174164 A1 | 9/2004 | Ao | |
| 2004/0237295 A1 | 12/2004 | Wakizaka et al. | |
| 2005/0195058 A1 | 9/2005 | Maurer et al. | |

US 7,884,690 B2

PRECISE MULTI-POLE MAGNETIC COMPONENT

This application is a Continuation of application Ser. No. 11/197,428 filed on Aug. 5, 2005 now U.S. Pat. No. 7,656,259 and for which priority is claimed under 35 U.S.C. §120, which is a Divisional application of U.S. application Ser. No. 10/718,626 filed on Nov. 24, 2003, now U.S. Pat. No. 7,114,237. This application also claims priority from Taiwanese Patent Application No. 092124245 filed on Sep. 2, 2003, the entire contents of which are hereby incorporated by reference.

TECHNICAL FIELD

The invention relates to a precise multi-pole magnetic component and the manufacturing method thereof. In particular, the invention pertains to a precise multi-pole magnetic component that formed by using the printed circuit board (PCB) technology and the corresponding manufacturing method.

BACKGROUND

Magnetic encoders are widely used to detect the rotation speed, angle and position in many precise control systems. They are quite rigid with simple structures, offering reliable operation in adverse environments where high vibration, temperature, moisture or dust may exist. Since the motor size is getting smaller, a strict condition is required for magnetic encoders with high resolution. Therefore, conventional magnetic encoders with wide magnetic pole pitch are not enough for using in precise control systems anymore. A precise magnetic encoder consists of a magnetic reading device and a multi-pole magnetic component with fine magnetic pole pitch. Its resolution is determined by the size of the magnetic pole pitch. The dimension of a monopole means the magnetic pole pitch. A smaller of the magnetic pole pitch provides a higher resolution in detection.

The signals in the multi-pole magnetic component can be detected using a magnetic reading device like Hall element or MR (magneto-resistance) element. The position and speed of a moving object can be obtained from detecting the rotation angle and direction of magnetic encoder. Generally, the multi-pole magnetic component with fine magnetic pole pitch in the magnetic encoder is achieved by magnetization. An unmagnetized magnetic component is placed onto the surface of a magnetizing head. The magnetizing coil is wound on the magnetizing head and the winding pattern is depended upon the design of the magnetizing head. Connecting the terminals of magnetizing coil to a magnetization machine which can provide the magnetizing current. After releasing a magnetizing current, the strong magnetic field is induced to magnetize the magnetic component. Therefore, a precise magnetizing head and a magnetization machine are required for narrowing the magnetic pole pitch of the multi-pole magnetic component. Traditionally, the multi-pole magnetizing head is obtained from the line-cutting process and the smallest magnetic pole pitch can be acquired about 1 mm by magnetization using the magnetizing head. The magnetic pole pitch of less than 1 mm is very difficult to achieve because it is limited by the precision of the machining tools and the bending angle of the magnetizing coils.

As described in the U.S. Pat. No. 4,920,326, the surface of the magnetizing head is divided into eight equal parts (16, 16', 18, 18', 20, 20' ... 30 and 30') by line-cutting process and the magnetizing coil (34) is wound into the groove as shown in FIG. 1. The grooves are located between any two parts. An alternate multi-pole magnetic field distribution is formed with an appropriate arrangement of the magnetizing coil. Both terminals (36 and 38) of the magnetizing coil are connected to a magnetization machine which can provide the magnetizing current. A strong magnetic field is induced instantaneously after the magnetization machine releases a magnetizing current. Then the magnetic component (40) is magnetized with a multi-pole structure. It is seen that the distance between the magnetic poles is limited by the machining technique and the minimum is about 1 mm. Besides, the insulating layer of the magnetizing coil can not withstand the stress and then breaks. It is caused by the large bending angle of the magnetizing coil being used in a magnetizing head with fine magnetic pole pitch. Therefore, a short circuit is happened on the bases (12 and 12') of the magnetizing head. Since the bases are made of a ferromagnetic material with high permeability, the magnetizing coil and head are exploded frequently during the magnetization. Thus this way is very dangerous.

To overcome the limitation of 1 mm in the magnetic pole pitch, a new magnetization method is introduced using the single-pulse magnetizing technique like the magnetic recording technology. The disclosed in the proceeding of Electrical Electronics Insulation Conference and Electrical Manufacturing & Coil Winding Conference (Chicago '93 EEIC/ICWA Exposition, P.237-242, 1993) is shown in FIG. 2. The magnetizing coils (200) are wound on the magnetizing head (201). The leakage of the magnetic field from the magnetizing head is used to write the magnetic pole pairs (i.e. N and S pole) onto the surface of the magnetic component (202). The magnetic pole pitch of less than 1 mm is accomplished successfully. Before magnetization, the magnetic component is mounted on a base which is usually supported and rotated by a high precision spindle motor. Then, the magnetic component is magnetized with magnetic pole pairs intermittently controlling by using a magnetization machine. The precise position control of the spindle motor is highly required; otherwise, an asymmetric magnetic file distribution will happen in the multi-pole magnetic component after magnetization and it is not good for subsequent processing of signals. In addition, the dimension of the magnetic component must be controlled uniformly. During the magnetization, the magnetic component will often collide with the magnetizing head if its radial run-out is too large and thus result in damages both of them. Moreover, the leaking gap in the magnetizing head and the air gap between the magnetizing head and the magnetic component have to be properly controlled. These are the key factors to affect the dimension of the magnetic pole pitch in magnetization. As the magnetic pole pitch on the magnetic component gets smaller, the leaking gap in the magnetizing head has to be narrowed as well. The air gap between the magnetizing head and the magnetic component must be appropriately tuned to obtain the desired magnetic pole pitch. Therefore, the manufacturing of a multi-pole magnetic component can be accomplished only under a precise controlling in magnetization and it is difficulty.

Besides, the waveform of the magnetizing current from the magnetization machine is required to modify in order to magnetize the magnetic component with different magnetic properties using the single-pulse magnetizing technique. Because the waveform of the magnetizing current highly depends upon the magnetic material property and this can be achieved only through a precise magnetization machine. In addition to controlling the tiny radial run-out and the material homogeneity on the magnetic component, it has to be mounted on a spindle motor under a precision position control. The desired magnetic pole pitch can be accomplished by tuning an appropriate leaking gap and the magnetizing air gap during the magnetization. Despite the fact that this technique can narrow the magnetic pole pitch to around 200 μm, the process is very complicated and difficult. The high precision machining, the techniques for making the precise magnetizing head and the magnetization machine are essential, and therefore the single-pulse magnetizing technique is costly and not economical at all.

SUMMARY

In view of the foregoing problems in the prior art, the invention provides a precise multi-pole magnetic component and the corresponding manufacturing method. Using the electromagnetic principles, an appropriate circuit pattern is designed and formed on the printed circuit board (PCB). An alternate and regular magnetic pole distribution is induced after a current is supplied to the circuit and then a multi-pole magnetic component is formed. The fine magnetic pole pitch in the multi-pole magnetic component is obtained from making the high-density wire circuit on the substrate using PCB manufacturing technology.

According to electromagnetism, supplying a long straight wire with a current will induce an annular magnetic field around the wire. The magnetic flux density is proportional to the current input, but inversely proportional to the distance. The invention designs a special circuit pattern and then it is formed on the PCB. After supplying a current to the circuit, the magnetic field is generated and its distribution is determined by the circuit pattern. Using this property and designing a special circuit pattern possessing with a meander structure, let the current flow in opposite directions on the circuit to generate an alternate magnetic pole distribution. At present, the minimum wire width on the circuit can be achieved is about 75 μm using PCB manufacturing technology. Thus the multi-pole magnetic component with fine magnetic pole pitch can be accomplished by forming the special circuit pattern on the PCB.

This disclosed precise multi-pole magnetic component can have both single-layer and multi-layer structures. The single-layer structure contains a substrate and a circuit built on the surface of the substrate. The multi-layer structure has more than one layer of circuit built on the surface of the substrate. An insulating layer is inserted between any two layers of circuits. All circuits on different layers are connected into a single circuit by drilling holes and filling them with soldering tin. On the top circuit layer, the current input and output (I/O) terminals are reserved for connecting to a current supplier. After supplying a current, the multi-layer structure can enhance the magnetic field and it is good for signal detection.

The above-mentioned precise multi-pole magnetic component can be accomplished using the PCB manufacturing technology. The size of the magnetic pole pitch is closely related to the manufacturing technology and the minimum value of 150 μm can be easily achieved at present. The PCB manufacturing technology greatly improves the resolution of magnetic encoders for high precision requirements.

We give a list of comparison among the conventional magnetization technology, the single-pulse magnetization technology, and the PCB manufacturing technology in Table 1.

To obtain a precise multi-pole magnetic component for being used in magnetic encoders. The precision machining, the magnetizing head and magnetization machine are necessary in the prior art for narrowing the pitch size to improve the resolution of magnetic encoders. Otherwise, it is impossible to do the job and the manufacturing cost is thus very high. However, if one uses the disclosed PCB manufacturing technology to make the precise multi-pole magnetic component with fine magnetic pole pitch, neither the precision machining nor the uses of magnetizing head and magnetization machine are required. The invention is not only simple but also completely feasible. PCB manufacturing technology is convenient for mass production at a lower cost.

The multi-pole magnetic field distribution of the disclosed precise multi-pole magnetic component is not formed by actually magnetizing a magnetic component. It is generated from supplying a current into the circuit on the PCB. One can readily obtain a desired precise multi-pole magnetic field distribution by designing an appropriate circuit pattern on a substrate using PCB manufacturing technology.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

TABLE 1

| Basic Requirements Technology | Magnetization Machine | Magnetizing Head | Precision Machining | Minimum Pole Pitch | Price |
|---|---|---|---|---|---|
| Conventional Magnetization | Yes | Yes | Yes | ~1 mm | High |
| Single-Pulse Magnetization | Yes | Yes | Yes | ~200 μm | Very High |
| PCB Manufacturing Technology | No | No | No | ~150 μm | Cheap |

Figure 8:
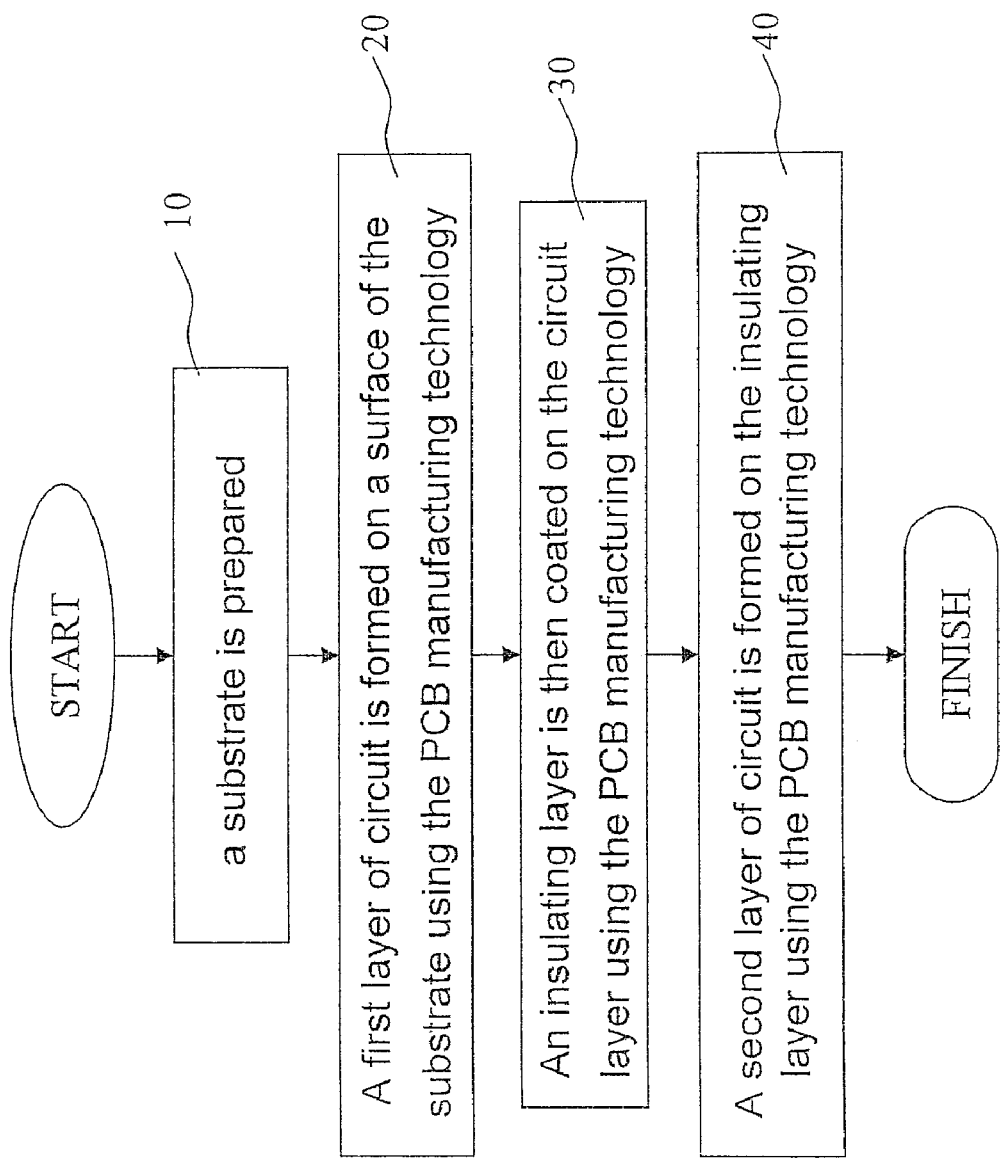

FIG. 8 shows the manufacturing procedure of the first embodiment of the invention.

DETAILED DESCRIPTION

The invention fabricates a special circuit pattern on the surface of a substrate. The multi-pole magnetic field distribution is generated after a current supplying to the circuit for producing the precise multi-pole magnetic component. Different magnetic pole pitches can be achieved easily by modifying the circuit patterns on PCB. The multi-layer structure of circuits is formed using PCB manufacturing process repeatedly. It can enhance the strength of the magnetic field and this is good for the signal detection. According to the invention, a special circuit pattern, which has a meander structure for providing the current to flow in opposite directions, is designed and formed on the PCB. Thus, the magnetic field is induced in different directions among the circuits to generate an alternate magnetic pole distribution. Then the multi-pole magnetic component is accomplished.

Figure 1:
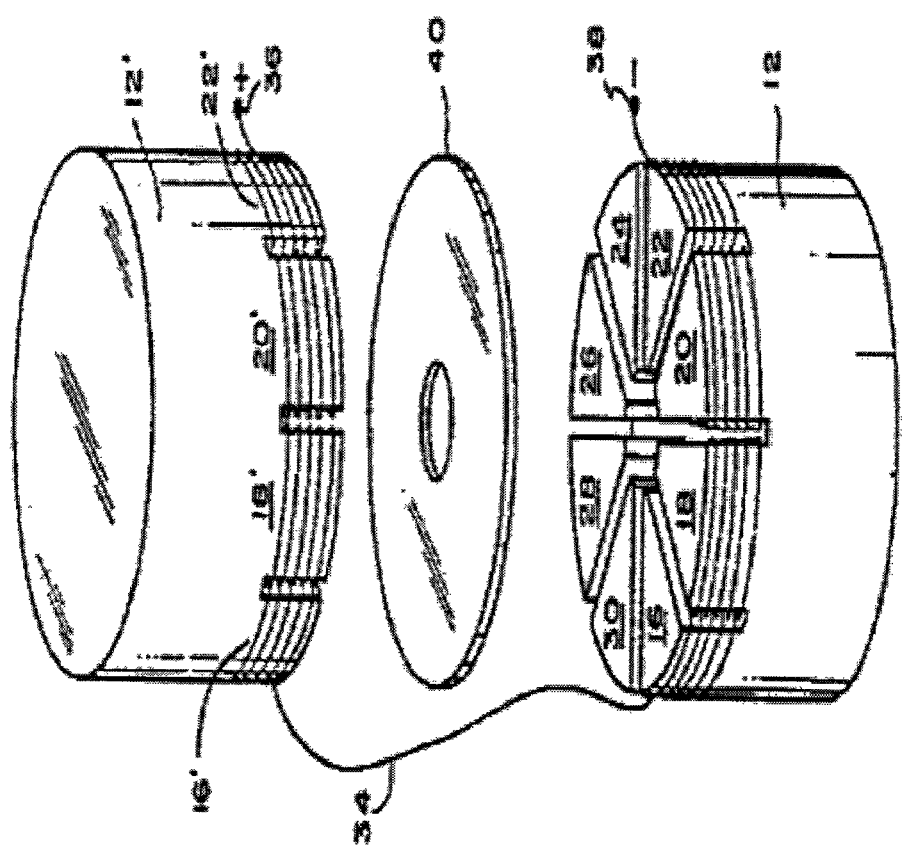
FIG. 1 is the embodiment of the magnetizing head in the prior art.
Figure 2:
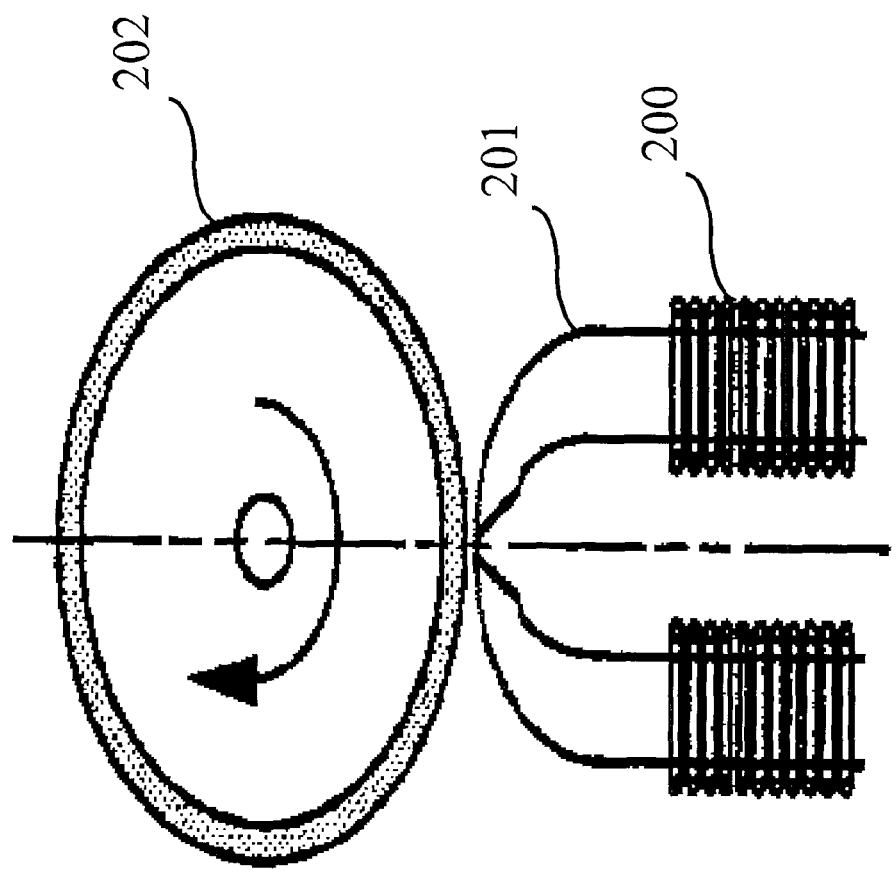
FIG. 2 is the embodiment of the single-pulse magnetizing method in the prior art.
Figure 3:
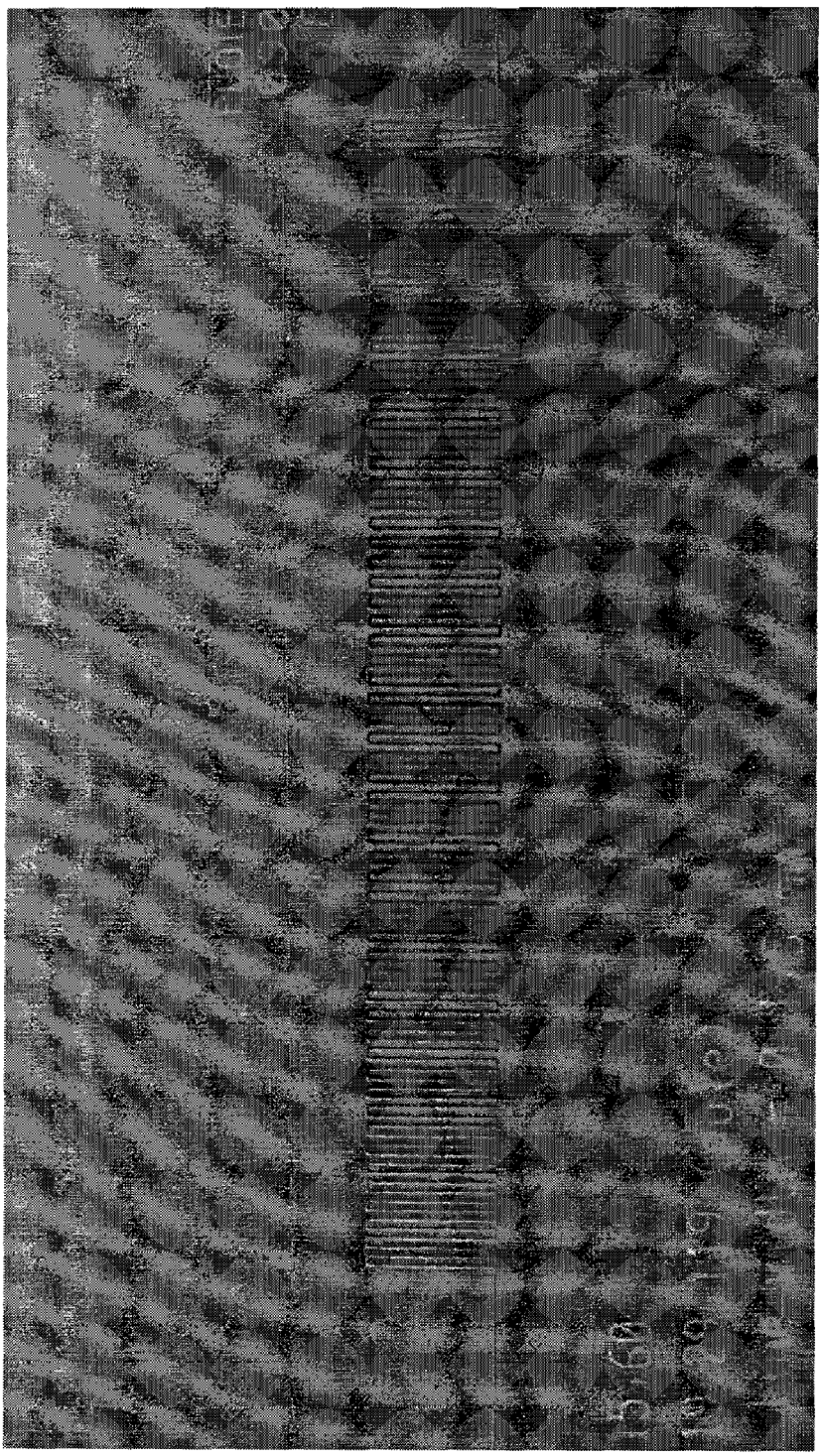
FIG. 3 is the first embodiment of the invention.
Figure 4A:
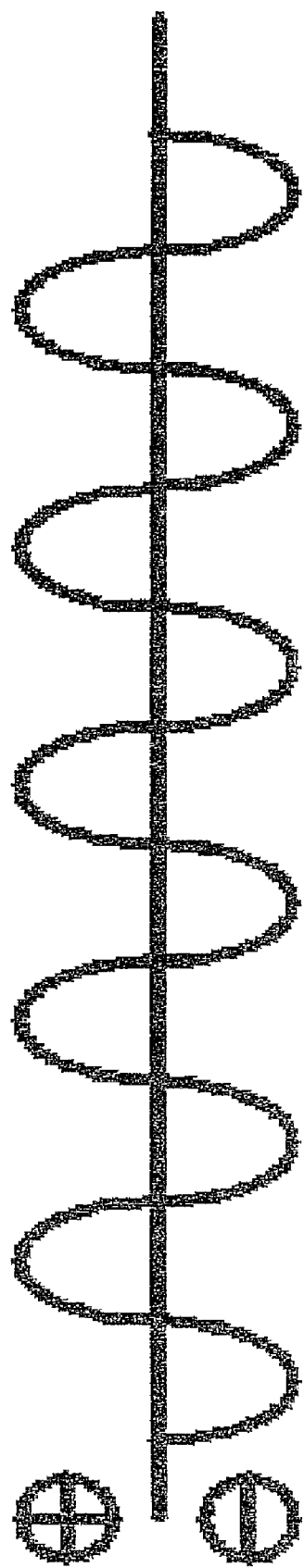
FIG. 4A is a schematic view of the magnetic field distribution in the first embodiment.
Figure 4B:
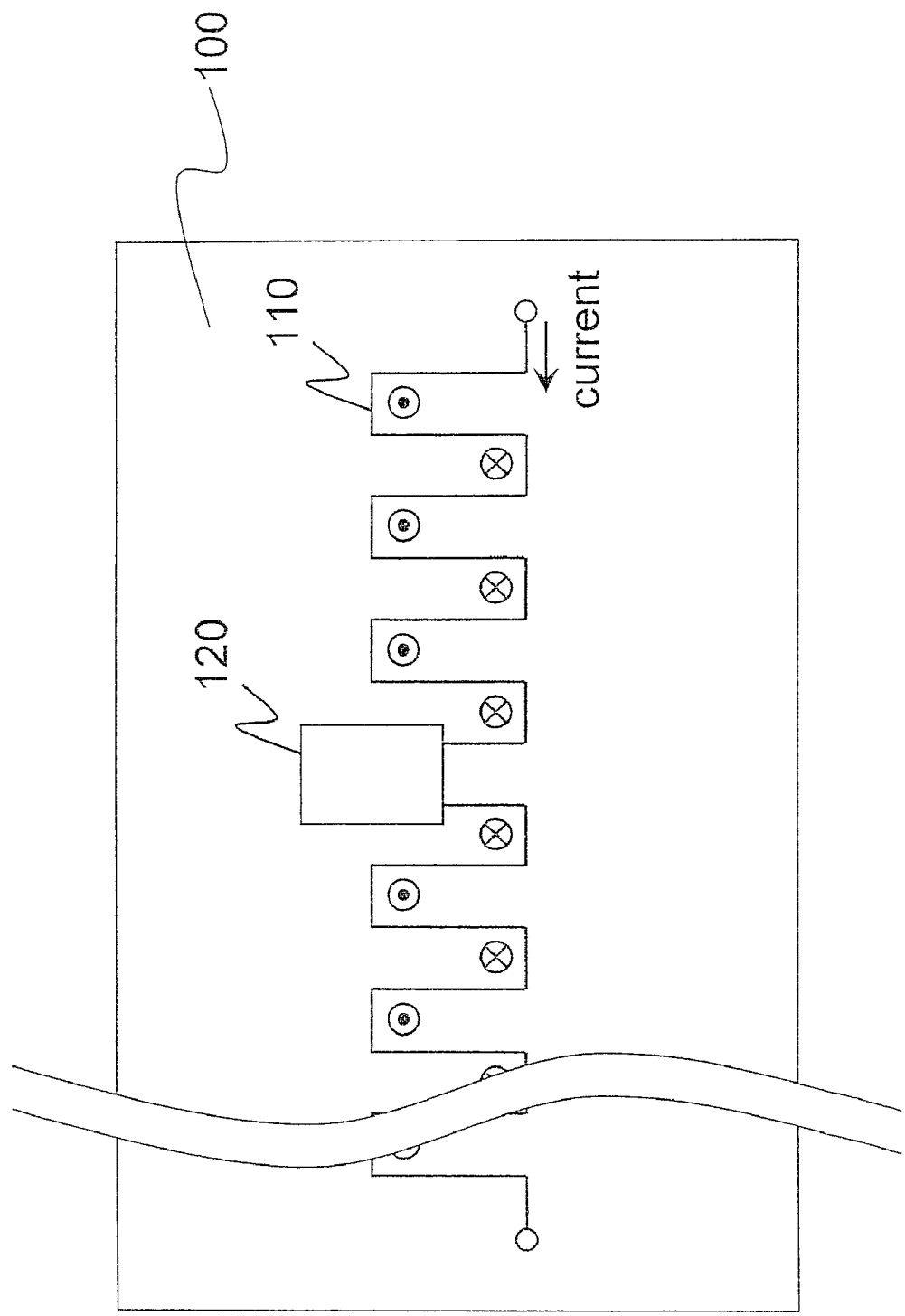
FIG. 4B is the first embodiment with an alternate magnetic pole structure.

FIG. 3 shows a experimental photo of the special circuit pattern according to one embodiment. As shown in the photo, on the surface of the PCB has a circuit pattern, which is a linear type extending along one-dimensional direction and has a meander structure for providing the current to flow in opposite directions. Therefore, magnetic fields pointing in different directions can be induced among the circuit, thereby producing an alternate magnetic pole distribution. FIG. 4A and FIG. 4B are the schematic views of the magnetic field distribution in the first embodiment and the magnetic field has an alternate magnetic pole structure extending along one-dimensional direction. The magnetic flux density produced by the circuit pattern 110 on the substrate 100 can be detected using a sensor 120, such as Hall sensor, magneto-resistance (MR) sensor, or giant magneto-resistance (GMR) sensor.

Figure 5:
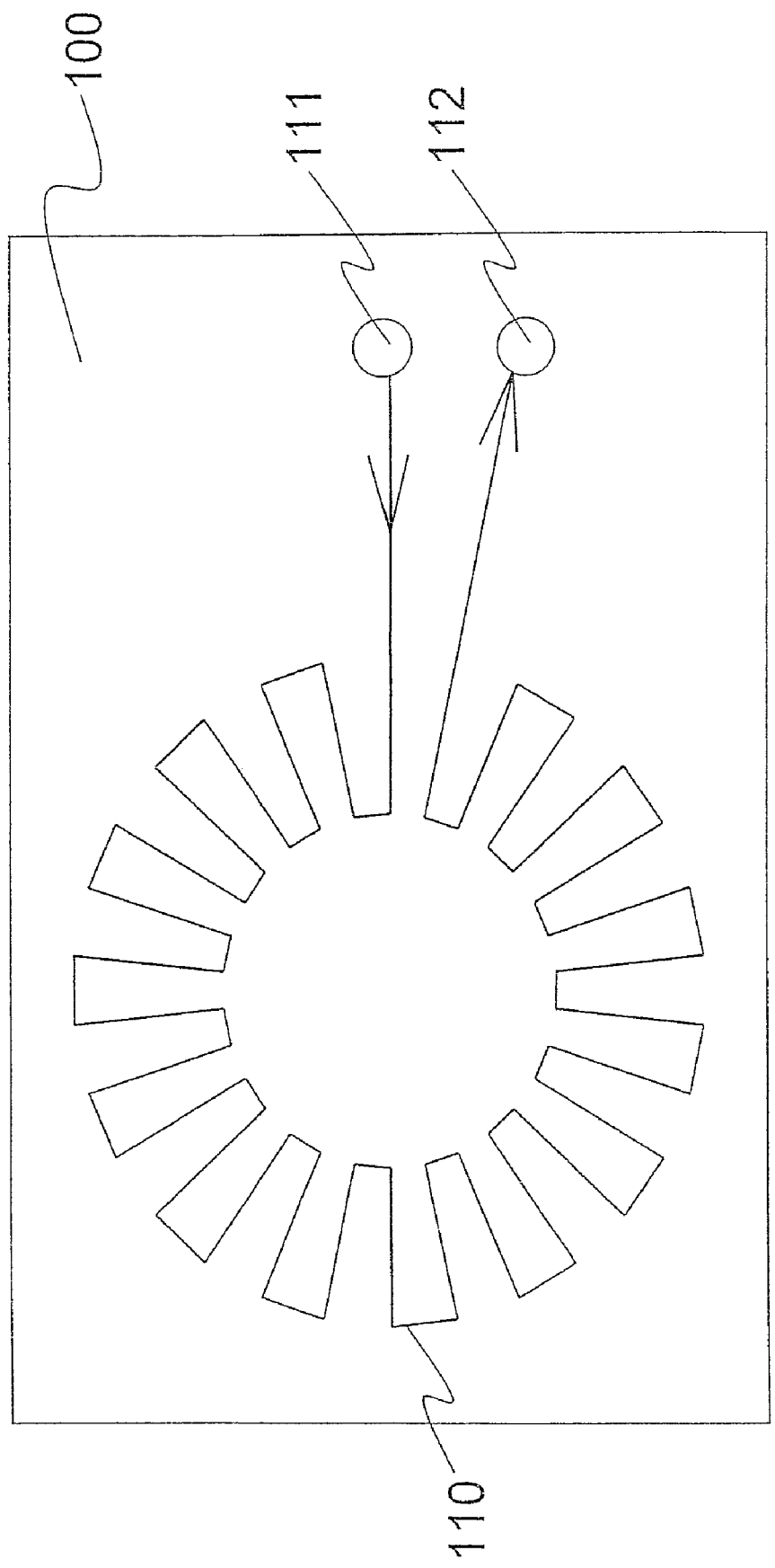
FIG. 5 is a schematic view of the circuit structure in the second embodiment of the invention.
Figure 6:
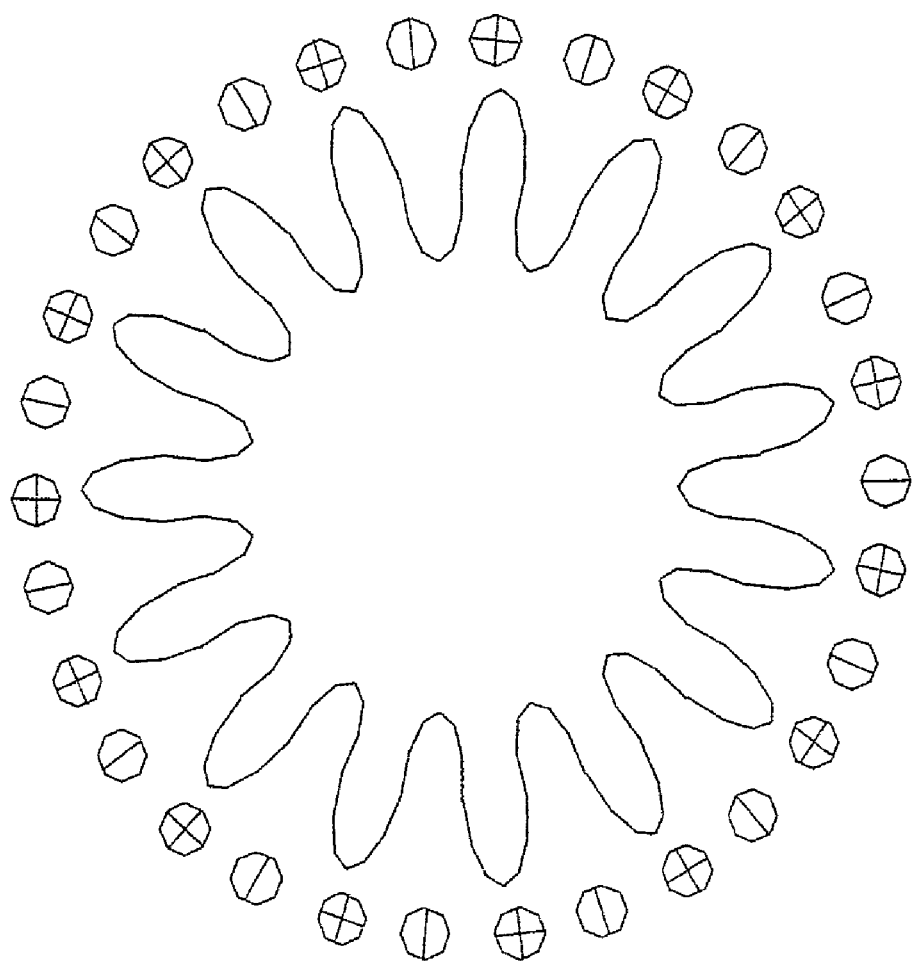
FIG. 6 is a schematic view of the magnetic field distribution in the second embodiment.

The magnetic field distribution can be easily extended from the one-dimensional structure to a two-dimensional one. An annular meander pattern, which provides the current to flow in opposite directions for producing the magnetic field in different directions among the circuit, can be obtained from modifying the circuit pattern on the PCB. As shown in FIG. 5, this is the schematic view of circuit structure in the second embodiment. An annular meander circuit pattern (110) is formed on the surface of a substrate (100). The current input terminal (111) and output terminal (112) are connected to a current supplier. Once a current is supplied, an alternate magnetic field distribution is induced among the circuit (110). The magnetic field distribution is an annular type in radial direction as shown in FIG. 6.

Figure 7:
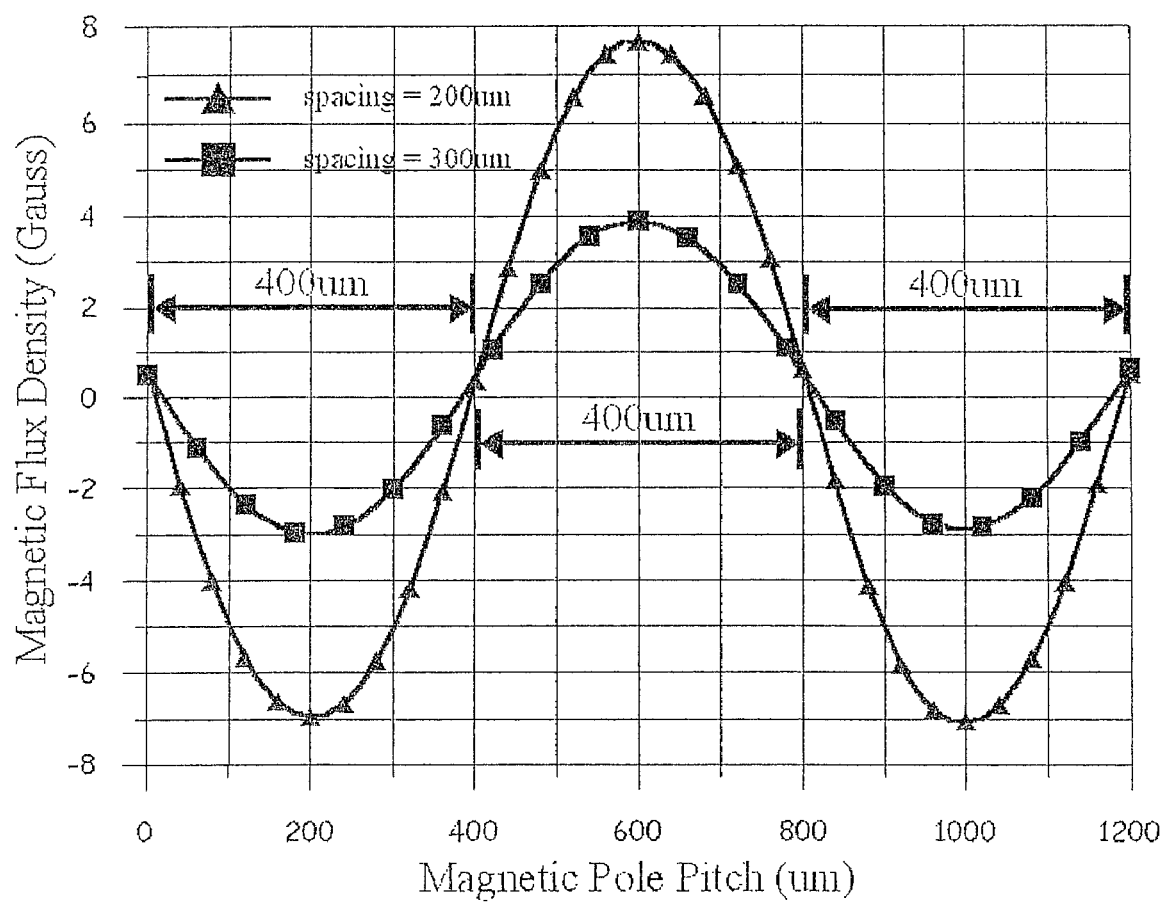
FIG. 7 shows the measured result of a partial magnetic field distribution produced by the disclosed linear 9-pole magnetic component.

To prove that the magnetic field produced by the circuit with a tiny wire width can be effectively detected and please refer to FIG. 7. It is the measured results of a partial magnetic field distribution of the disclosed linear 9-pole magnetic component. Three consecutive magnetic poles of the magnetic flux density distributions are measured at a detection spacing of 200 μm and 300 μm above the surface by using a precise Hall probe with a high sensitivity of 0.1 gauss. The width of the circuit wires on the substrate is designed and formed with 200 μm and the gap between two adjacent circuit wires is also 200 μm. Therefore, the size of the magnetic pole pitch is 400 μm. After supplying 1 A current, the measured magnetic field distribution is not only uniform but also the obvious boundaries existing between the magnetic poles. The signals of the magnetic field distributions are enough to be as the signals for detection.

The precise multi-pole magnetic component made by using the PCB manufacturing technology can also have double-layer or even multi-layer structures to enhance the strength of the magnetic fields among the circuits. FIG. 8 shows the manufacturing procedure of the disclosed first embodiment. First, a substrate is prepared (step 10). The first layer of the circuit pattern is formed on the surface of the substrate using the PCB manufacturing technology (step 20). An insulating layer is then added on the circuit layer using the PCB manufacturing technology (step 30). The second layer of the circuit pattern is formed on the insulating layer using the PCB manufacturing technology (step 40). Steps 30 and 40 are repeated until the desired circuit layers are completed. All circuits on different layers have to be connected into a single circuit by drilling holes and filling them with soldering tin. Only the current input and output (I/O) terminals on the top circuit layer are reserved for connecting to a current supplier. Each layer of the circuit has a meander pattern for providing a current to flow in opposite directions and then an alternate magnetic pole distribution is generated. The magnetic field distribution of each layer of the circuit on the substrate is arranged appropriately to stack with an enhancing configuration.

The disclosure being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A precise multi-pole magnetic component comprising:
   a substrate;
   a circuit, formed on a surface of the substrate, the circuit comprising:
      a current input terminal for inputting current;
      a current output terminal; and
      a connecting conductive line, connected between the current input terminal and the current output terminal, having a continuous meander pattern to separate a plurality of intervals continuously distributing; and
   a current supplier, connected to the current input terminal and the current output terminal, for providing the current,
   wherein when the current flows through the connecting conductive line with the continuous meander pattern, a plurality of magnetic fields are induced through the plurality of intervals, respectively, and
   wherein the plurality of magnetic fields have at least one positive magnetic pole and at least one negative magnetic pole, and the at least one positive magnetic pole and the at least one negative magnetic pole are alternately distributed.

2. The precise multi-pole magnetic component of claim 1, wherein the plurality of intervals of the connecting conductive line are distributed along one-dimensional direction.

3. The precise multi-pole magnetic component of claim 1, wherein the plurality of intervals of the connecting conductive line are distributed with an annular pattern.

4. The precise multi-pole magnetic component of claim 1, wherein a gap width of each of the plurality of intervals of the connecting conductive line is between 75 μm to 2500 μm.

5. The precise multi-pole magnetic component of claim 1, wherein a wire width of the connecting conductive line is between 75 μm to 2500 μm.

6. A magnetic encoder comprising:
a printed circuit board, having at least one layer;
a circuit, formed on one of the at least one layer, the circuit comprising:
  a current input terminal, for inputting current;
  a current output terminal; and
  a connecting conductive line, connected between the current input terminal and the current output terminal, having a continuous meander pattern to separate a plurality of intervals continuously being distributed;
a current supplier, connected to the current input terminal and the current output terminal, for providing the current, wherein when the current flows through the connecting conductive line with the continuous meander pattern, a plurality of magnetic fields are induced through the plurality of intervals, respectively, and wherein the plurality of magnetic fields have at least one positive magnetic pole and at least one negative magnetic pole, and the at least one positive magnetic pole and the at least one negative magnetic pole are alternately distributed; and
a sensor, disposed above the printed circuit board corresponding to the continuous meander pattern, for detecting magnetic flux density of one of the plurality of magnetic fields induced.

7. The magnetic encoder of claim 6, wherein the plurality of intervals of the connecting conductive line are distributed along one-dimensional direction.

8. The magnetic encoder of claim 6, wherein the plurality of intervals of the connecting conductive line are distributed with an annular pattern.

9. The magnetic encoder of claim 6, wherein a gap width of each of the plurality of intervals of the connecting conductive line is between 75 μm to 2500 μm.

10. The magnetic encoder of claim 6, wherein a wire width of the connecting conductive line is between 75 μm to 2500 μm.

11. A precise multi-pole magnetic component comprising:
a substrate;
a circuit, formed on a surface of the substrate, the circuit comprising:
  a current input terminal for inputting current;
  a current output terminal; and
  a connecting conductive line, connected between the current input terminal and the current output terminal, having a continuous meander pattern to separate a plurality of intervals continuously distributing; and
wherein when the current flows through the connecting conductive line with the continuous meander pattern, a plurality of magnetic fields are induced through the plurality of intervals, respectively, and
wherein the plurality of magnetic fields have at least one positive magnetic pole and at least one negative magnetic pole, and the at least one positive magnetic pole and the at least one negative magnetic pole are alternately distributed.

12. The precise multi-pole magnetic component of claim 11, further comprising:
a current supplier, connected to the current input terminal and the current output terminal, for providing the current.

* * * * *